US012509761B2

(12) United States Patent
Liu et al.

(10) Patent No.: US 12,509,761 B2
(45) Date of Patent: Dec. 30, 2025

(54) DEPOSITION APPARATUS AND DEPOSITION METHOD

(71) Applicants: InnoLux Corporation, Miao-Li County (TW); CARUX TECHNOLOGY PTE. LTD., Singapore (SG)

(72) Inventors: Cheng-Wei Liu, New District (TW); Liang-Cheng Ma, Miao-Li County (TW)

(73) Assignees: Innolux Corporation, Miaoli County (TW); CARUX TECHNOLOGY PTE. LTD., Singapore (SG)

( * ) Notice: Subject to any disclaimer, the term of this patent is extended or adjusted under 35 U.S.C. 154(b) by 0 days.

(21) Appl. No.: 18/403,941

(22) Filed: Jan. 4, 2024

(65) Prior Publication Data

US 2024/0263298 A1 Aug. 8, 2024

Related U.S. Application Data

(60) Provisional application No. 63/483,768, filed on Feb. 8, 2023.

(30) Foreign Application Priority Data

Nov. 2, 2023 (CN) ......................... 202311450426.2

(51) Int. Cl.
*H01J 37/34* (2006.01)
*C23C 14/34* (2006.01)
(Continued)

(52) U.S. Cl.
CPC ........ *C23C 14/3464* (2013.01); *C23C 14/505* (2013.01); *H01J 37/32403* (2013.01); *H01J 37/32733* (2013.01); *H01J 37/3447* (2013.01)

(58) Field of Classification Search
CPC . C23C 14/3464; C23C 14/505; C23C 14/046; C23C 14/34; C23C 14/044;
(Continued)

(56) References Cited

U.S. PATENT DOCUMENTS 4,814,056 A * 3/1989 Welty ...................... C23C 14/22 204/192.12
5,738,729 A 4/1998 Dubs
(Continued)

FOREIGN PATENT DOCUMENTS

CN 207108824 A 3/2018
CN 111952200 A 11/2020
(Continued)

OTHER PUBLICATIONS

Machine Translation of JP09-078235 (Year: 1997).*
(Continued)

*Primary Examiner* — Rodney G McDonald
(74) *Attorney, Agent, or Firm* — JCIPRNET

(57) ABSTRACT

A deposition apparatus is provided, including a deposition chamber, at least one target, at least one substrate holder, and at least one adjustment plate. The at least one target, the at least one substrate holder, and the at least one adjustment plate are disposed in the deposition chamber, and the at least one adjustment plate is disposed between the at least one target and the at least one substrate holder. The at least one substrate holder includes a base portion, a first supporting portion, and a second supporting portion. The base portion has a flat surface. The first supporting portion is disposed on the flat surface and includes a curved surface. The second supporting portion is disposed on the flat surface and protrudes from it.

20 Claims, 6 Drawing Sheets

(51) Int. Cl.
*C23C 14/50* (2006.01)
*H01J 37/32* (2006.01)

(58) Field of Classification Search
CPC .............. C23C 14/568; H01J 37/32366; H01J 37/32403; H01J 37/32733; H01J 37/34; H01J 37/3417; H01J 37/3447; H01L 21/68735; H01L 21/6875; H01L 21/68764
USPC ............................ 204/298.01–298.41, 192.12
See application file for complete search history.

(56) References Cited

U.S. PATENT DOCUMENTS

| | | | | |
|---|---|---|---|---|
| 6,001,183 | A * | 12/1999 | Gurary | C23C 16/4584 118/730 |
| 6,865,065 | B1 | 3/2005 | Chen | |
| 11,501,980 | B2 | 11/2022 | Onishi | |
| 11,881,386 | B2 | 1/2024 | Kuo | |
| 2002/0046946 | A1* | 4/2002 | Shimoda | C23C 14/044 204/298.25 |
| 2007/0178708 | A1 | 8/2007 | Ukigaya | |
| 2014/0154403 | A1 | 6/2014 | Lee | |
| 2014/0205844 | A1* | 7/2014 | Sugawara | C23C 14/35 428/448 |
| 2015/0114297 | A1* | 4/2015 | Kawato | C23C 14/042 118/726 |
| 2018/0166314 | A1 | 6/2018 | Ellis | |

FOREIGN PATENT DOCUMENTS

| | | | |
|---|---|---|---|
| CN | 113061863 | A | 7/2021 |
| CN | 214612743 | U | 11/2021 |
| CN | 114075650 | A | 2/2022 |
| JP | 09-078235 | * | 3/1997 |
| JP | 09-125240 | * | 5/1997 |
| KR | 1020170131892 | A | 12/2017 |
| TW | I778250 | B | 9/2022 |
| WO | 2015180798 | A1 | 12/2015 |
| WO | 2021052831 | A1 | 3/2021 |

OTHER PUBLICATIONS

Machine Translation JP 09-125240 (Year: 1997).*
Chinese language office action dated Apr. 29, 2024, issued in application No. TW 112145470.
Partial European Search Report dated Jul. 18, 2024, issued in application No. EP 24151775.4.
Extended European Search Report dated Apr. 23, 2025, issued in application No. EP 24151775.4.

* cited by examiner

DEPOSITION APPARATUS AND DEPOSITION METHOD

CROSS REFERENCE TO RELATED APPLICATIONS

This application claims the benefit of U.S. Provisional Application No. 63/483,768, filed Feb. 8, 2023, and China Patent Application No. 20231450426.2, filed Nov. 2, 2023, the entirety of which are incorporated by reference herein.

BACKGROUND OF THE DISCLOSURE

Field of the Disclosure

The application relates in general to a deposition apparatus and a deposition method, and in particular, to a deposition apparatus and a deposition method that are applied on a substrate with a curved surface.

Description of the Related Art

Recently, various curved electronic products have been released. A curved screen can reduce interference from external light and improve contrast, so that a user can comfortably watch images on the curved screen without those images being deformed or distorted. Moreover, some curved electronic products can make them easier to place or hold.

BRIEF SUMMARY OF DISCLOSURE

An embodiment of the disclosure provides a deposition apparatus, including a deposition chamber, at least one target, at least one substrate holder, and at least one adjustment plate. The at least one target, the at least one substrate holder, and the at least one adjustment plate are disposed in the deposition chamber, and the at least one adjustment plate is disposed between the at least one target and the at least one substrate holder. The at least one substrate holder includes a base portion, a first supporting portion, and a second supporting portion. The base portion has a flat surface. The first supporting portion is disposed on the flat surface and includes a curved surface. The second supporting portion is disposed on, and protrudes from, the flat surface.

An embodiment of the disclosure also provides a deposition method, including: providing at least one substrate, wherein the at least one substrate includes a flat surface section and a curved surface section; providing at least one substrate holder; disposing the at least one substrate on the at least one substrate holder to form at least one substrate holder with a substrate, and forming an included angle between the flat surface section and the flat surface of the at least one substrate holder, wherein the included angle is greater than 0 degrees and less than or equal to 90 degrees; providing a deposition chamber, wherein a first target, a second target, a first adjustment plate, and a second adjustment plate are disposed in the deposition chamber; rotating the at least one substrate holder with a substrate to a position corresponding to the first target in the deposition chamber, wherein the first adjustment plate is disposed between the first target and the at least one substrate holder with a substrate; depositing the material of the first target on the at least one substrate; rotating the at least one substrate holder with a substrate to a position corresponding to the second target in the deposition chamber, wherein the second adjustment plate is disposed between the second target and the at least one substrate holder with a substrate; and depositing the material of the second target on the material of the first target that is on the at least one substrate.

BRIEF DESCRIPTION OF DRAWINGS

The disclosure can be more fully understood by reading the subsequent detailed description and examples with references made to the accompanying drawings, wherein.

DETAILED DESCRIPTION OF DISCLOSURE

Figure 1:
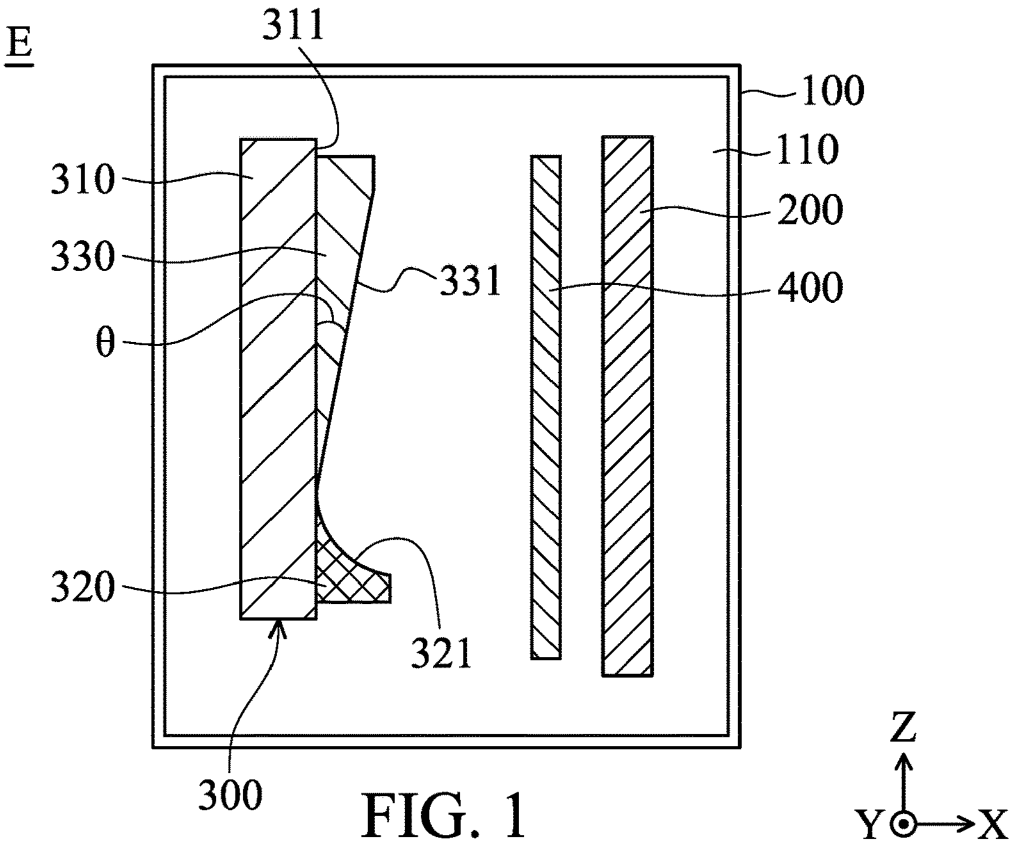
FIG. 1 is a schematic diagram of a deposition apparatus according to an embodiment of the disclosure.

The making and using of the embodiments of the deposition apparatus and the deposition method are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms “include”, “comprise” and “have” are used in an open-ended fashion, and thus should be interpreted to mean “include, but not limited to . . . ”. Thus, when the terms “include”, “comprise” and/or “have” are used in the description of the present disclosure, the corresponding features, areas, steps, operations and/or components would be pointed to existence, but not limited to the existence of one or a plurality of the corresponding features, areas, steps, operations and/or components.

In addition, in this specification, relative expressions are used. For example, "below" and "above" are used to describe the position of one element relative to another. It should be appreciated that if a device is flipped upside down, an element that is "below" will become an element that is "above".

When the corresponding component (such as layer or area) is referred to "on another component (or the variant thereof)", it may be directly on another component, or other component may exist between them. On the other hand, when the component is referred to "directly on another component (or the variant thereof)", any component does not exist between them. Moreover, when a component is referred to "on another component (or the variant thereof)", the component and the other component has a positional relationship in a top view direction, the component can be disposed above or below the other component, and the positional relationship is based on the orientation of the device.

In some embodiments of the disclosure, terms concerning attachments, coupling and the like, such as "connected", refer to a relationship wherein structures are secured or attached to one another either directly or indirectly through intervening structures, unless expressly described otherwise.

It should be understood that, although the terms "first", "second", etc. can be used herein to describe various elements, layers and/or sections, these elements, layers and/or sections should not be limited by these terms. These terms are only used to distinguish one element layer or section from another element, layer or section. Thus, a first element, layer or section discussed below could be termed a second element, layer or section without departing from the teachings of the present disclosure. For brevity, the terms "first", "second", etc. may not be used in the specification. The first element and/or the second element in claims can refer to any element that meets the description in the specification without departing from the spirit and scope of the invention as defined by the appended claims.

The terms "about" and "substantially" typically mean +/−15% of the stated value, for example, +/−10%, +/−5%, +/−3%, +/−2%, +/−1%, or +/−0.5% of the stated value. The stated value of the present disclosure is an approximate value. When there is no specific description to the terms "about" and "substantially", the stated value includes the meaning of "about" or "substantially". Unless defined otherwise, all technical and scientific terms used herein have the same meaning as commonly understood by one of ordinary skill in the art to which this disclosure belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise. Moreover, for brevity, some elements can be suitably omitted in the figures.

FIG. 1 is a schematic diagram of a deposition apparatus E according to an embodiment of the disclosure. The deposition apparatus E can deposit on the substrate of various electronic devices. For example, the electronic devices can include a display device, a backlight device, an antenna device, a sensing device, a tiled device, or the combination thereof, but it is not limited thereto. The display device can be a non-self-emitting type display device or a self-emitting type display device. The antenna device can be a liquid crystal type antenna device or a non-liquid crystal type antenna device. The sensing device can be a sensing device for sensing capacitance, light, heat, or ultrasonic, but it is not limited thereto. The tiled device can be a tiled display device or a tiled antenna device, but it is not limited thereto. The electronic device can be a bendable electronic device or a flexible electronic device. The electronic device can include a passive element and an active element, such as a capacitance, a resistance, an inductance, a diode, a transistor, or etc. The diode can include a light-emitting diode or a photoelectric diode. For example, the light-emitting diode can include an organic light-emitting diode (OLED), a mini LED, a micro LED, or a quantum dot LED, but it is not limited thereto. It should be noted that, the electronic device can be a combination having one or more aforementioned devices, but it is not limited thereto.

Figure 2:
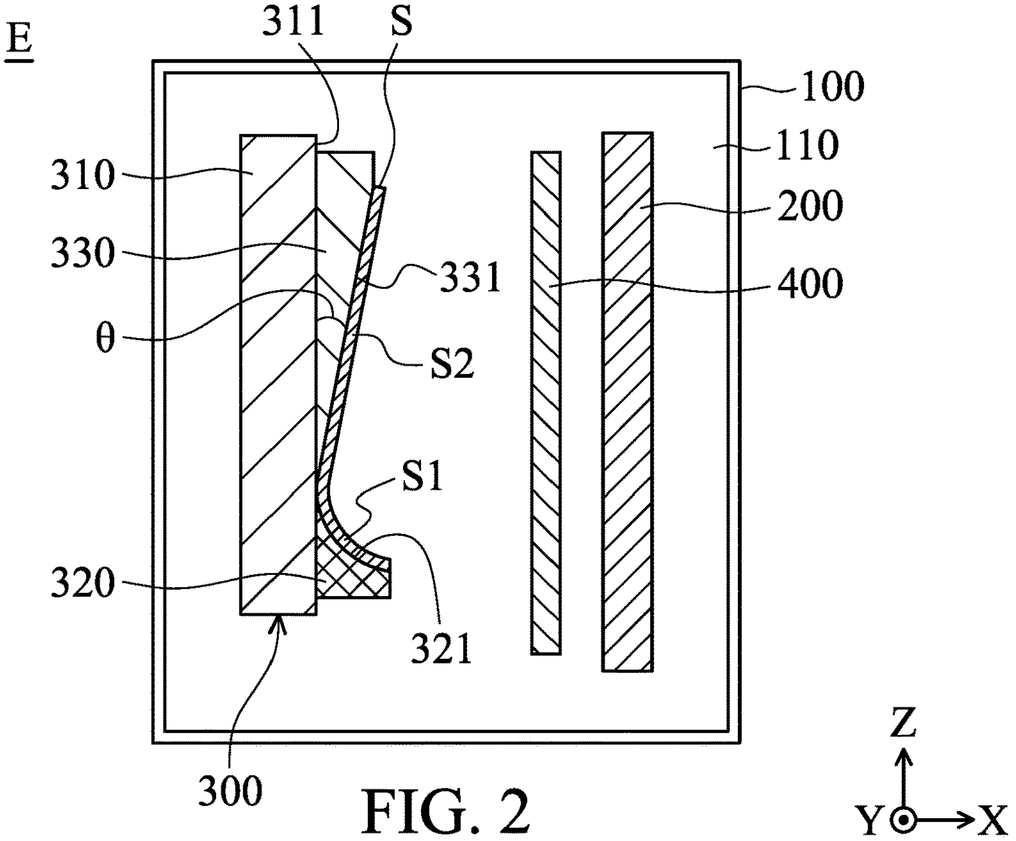
FIG. 2 is a schematic diagram representing that a substrate is disposed in the deposition apparatus according to an embodiment of the disclosure.

The deposition apparatus E primarily includes a deposition chamber 100, a target 200, a substrate holder 300, and an adjustment plate 400. The deposition chamber 100 has an inner space 110. The target 200, the substrate holder 300, and the adjustment plate 400 can be disposed in the inner space 110. The adjustment plate 400 can be disposed between the target 200 and the substrate holder 300. As shown in FIG. 2. When the user uses the deposition apparatus E to deposit on a substrate S, the substrate S can be disposed on the substrate holder 300, and the material of the target 200 can pass through the adjustment plate 400 and fall on the substrate S to form a coated film on the substrate S.

The substrate holder 300 includes a base portion 310, a first supporting portion 320, and a second supporting portion 330. The base portion 310 has a flat surface 311 facing the target 200, and the first supporting portion 320 and the second supporting portion 330 are disposed on the flat surface 311 and protrude therefrom. In this embodiment, the first supporting portion 320 and the second supporting portion 330 are adjacent to each other, the first supporting portion 320 has a curved surface 321, and the second supporting portion 330 has an inclined surface 331. Thus, the curved surface 321 and the inclined surface 331 can be connected to each other, and an included angle θ can be formed between the inclined surface 331 and the flat surface 311 of the base portion 310.

The substrate S has a curved surface section S1 and a flat surface section S2. The curvature of the curved surface 321 of the first supporting portion 320 matches the curvature of the curved surface section S1, and the slope of the inclined surface 321 of the second supporting portion 330 matches the slope of the flat surface section S2. Therefore, when the substrate S is disposed on the substrate holder 300, the curved surface section S1 and the flat surface section S2 are respectively in contact with and attached to the curved surface 321 of the first supporting portion 320 and the inclined surface 331 of the second supporting portion 330. The included angle θ is also formed between the flat surface section S2 of the substrate S and the flat surface 311 of the base portion 310. For example, the inclined angle θ can be greater than 0 degrees and less than 90 degrees, but it is not limited thereto. In some embodiments, the included angle θ can be ranged from 1 degree to 50 degrees (1°≤included angle θ≤50°).

Owing to the aforementioned structure of the substrate holder 300, the curved surface section S1 can be prevented from blocking when the substrate S is to be deposited. Thereby, the film thickness on every portions of the substrate S is substantially uniform, or the color difference of the substrate S after the film is coated can be reduced. For example, the difference of the film thickness on the curved surface section S1 of the substrate S and the film thickness on the flat surface section S2 of the substrate S can be less than or equal to 10% (such as be ranged from 0.5% to 10% (0.5%≤the difference of the film thickness≤10%)), but it is not limited thereto.

In this embodiment, the first supporting portion 320 and the second supporting portion 330 can affixed to the base portion 310 independently. Therefore, when the user wants to deposit on a substrate that has the curved surface section with different curvature and/or the flat surface section with different slop, the first supporting portion 320 and/or the second supporting portion 330 can be detached from the base portion 310 and replaced by the first supporting portion having the corresponding curvature and/or the second supporting portion having the corresponding slope. Therefore, it is facilitated the usage of the deposition apparatus E or the cost of deposition by using the deposition apparatus E can be reduced.

Although there is one target, one substrate holder, and one adjustment plate disposed in one deposition chamber shown in FIG. 1 and FIG. 2, a plurality of targets, multiple substrate holders, and multiple adjustment plates can be disposed in one deposition chamber in some embodiments (not shown). Thus, the speed and the yield of forming a film with multiple layers can be facilitated. In detail, the multiple targets can be disposed in the deposition chamber. Each of the substrate holders can include a base portion having a flat surface, a first supporting portion having a curved surface and disposed on the flat surface of the base portion, and a second supporting portion disposed on the flat surface of the base portion and protruding therefrom, as mentioned before. The multiple adjustment plates are disposed in the deposition chamber, and each adjustment plate is disposed between one of the multiple targets and one of the substrate holders.

Referring to FIG. 3A to FIG. 3D, in some embodiments, the deposition apparatus E includes a plurality of pad units 500 disposed on the substrate holder 300. In detail, each of the pad units 500 includes a pad base 510, a pad 520, and at least one spring 530. The pad base 510 can pass through the hole H on the substrate holder 300 and can be exposed from the surface that is configured to be in contact with the substrate S (i.e. the curved surface 321 and the inclined surface 331). The pad 520 is disposed on the pad base 510 and has an adhesive material. Therefore, when the substrate S is disposed on the substrate holder 300, the substrate S is in contact with the pad 520, and the firmness of affixing the substrate S to the substrate holder 300 can be enhanced. An end of the spring 530 is connected to the pad base 510, and the other end of the spring 530 is connected to the deposition chamber 100 or the base portion 310. The spring 530 can provide a buffer when a vibration is generated during the film is coated on the substrate S.

Figures 3A, 3B, 3C:
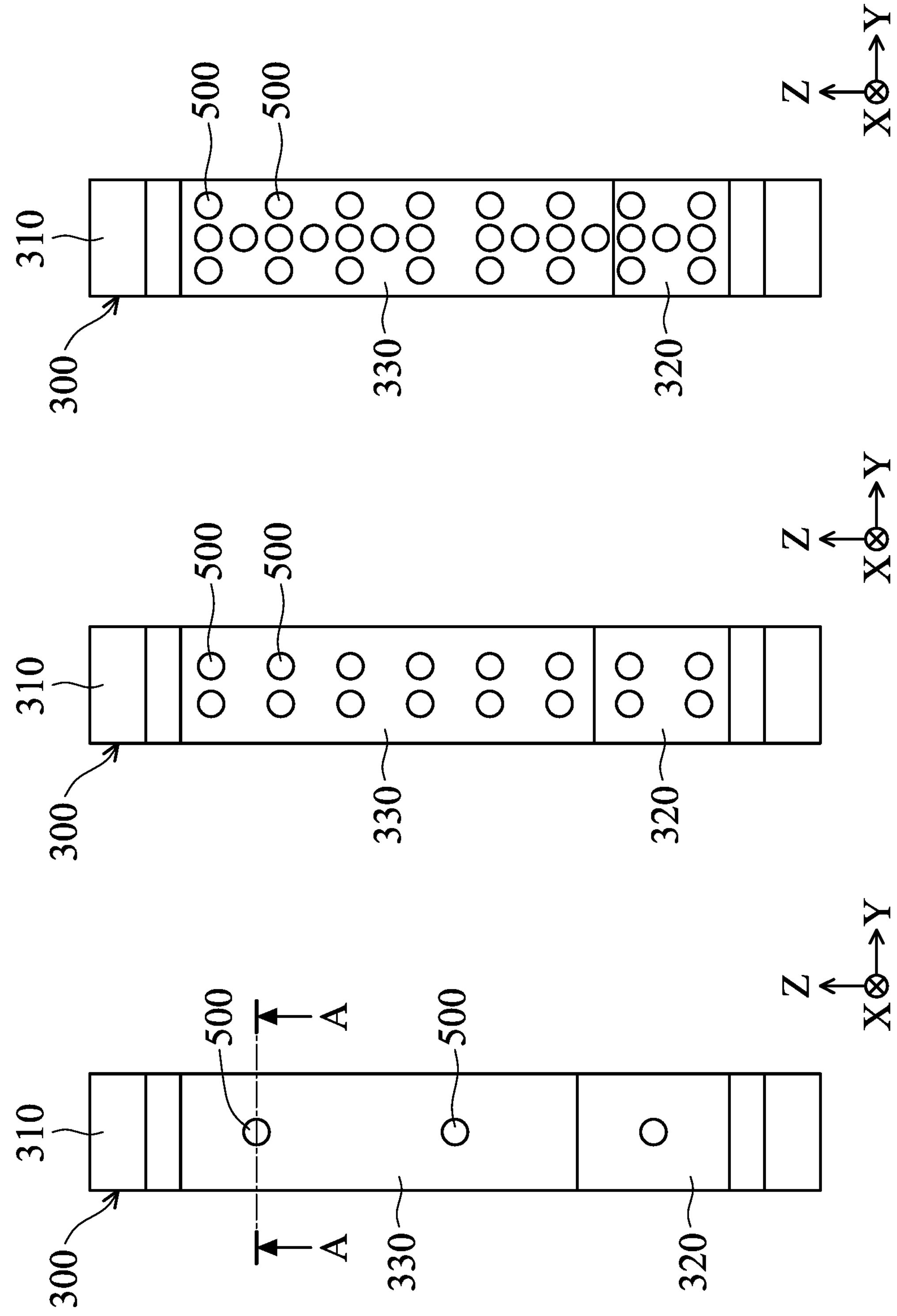
FIG. 3A is a schematic diagram of the substrate holder and the pad units according to some embodiments of the disclosure.
FIG. 3B is a schematic diagram of the substrate holder and the pad units according to some embodiments of the disclosure.
FIG. 3C is a schematic diagram of the substrate holder and the pad units according to some embodiments of the disclosure.
Figure 3D:
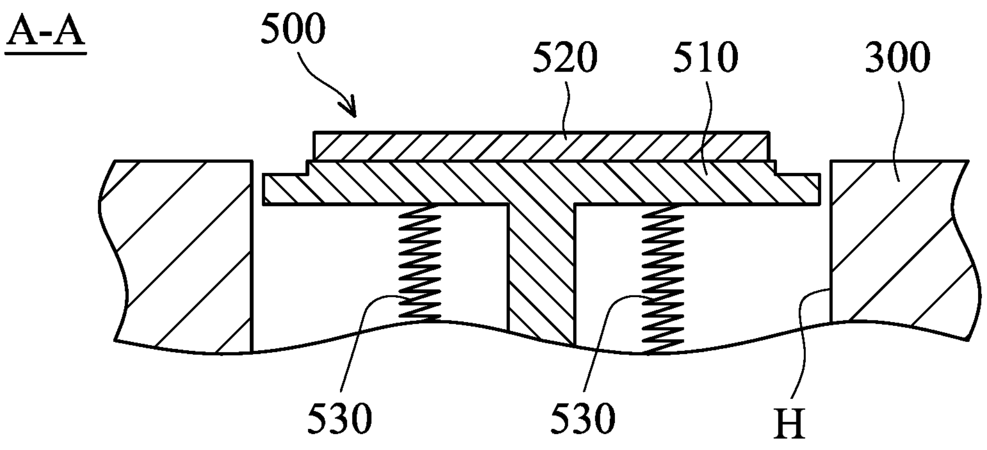
FIG. 3D is a cross-sectional view taken along the line A-A in FIG. 3A.
Figure 3E:
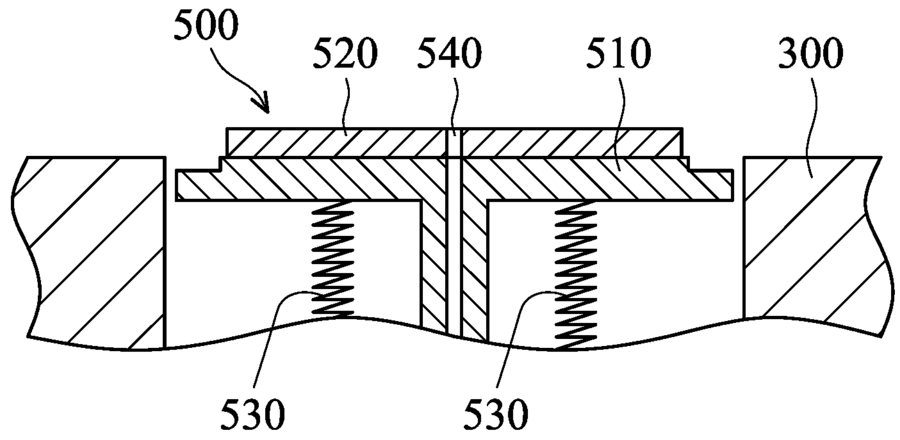
FIG. 3E is a schematic diagram of the pad unit according to some embodiments of the disclosure.

Referring to FIG. 3E, in some embodiments, each of the pad units 500 further includes a vacuum suction hole 540. The vacuum suction hole 540 can penetrate the pad base 510 and the pad 520, and connect to a vacuum generator (not shown). Therefore, when the substrate S is disposed on the substrate holder 300, the vacuum generator can pump out from the vacuum suction hole 540, and the substrate S can be affixed to the substrate holder 300 more steadily.

It should be noted that, the number and the arrangement of the pad units 500 can be adjusted as required. The number and the arrangement shown in FIG. 3A, FIG. 3B, or FIG. 3C is merely an example, it is not limited thereto.

Figure 4:
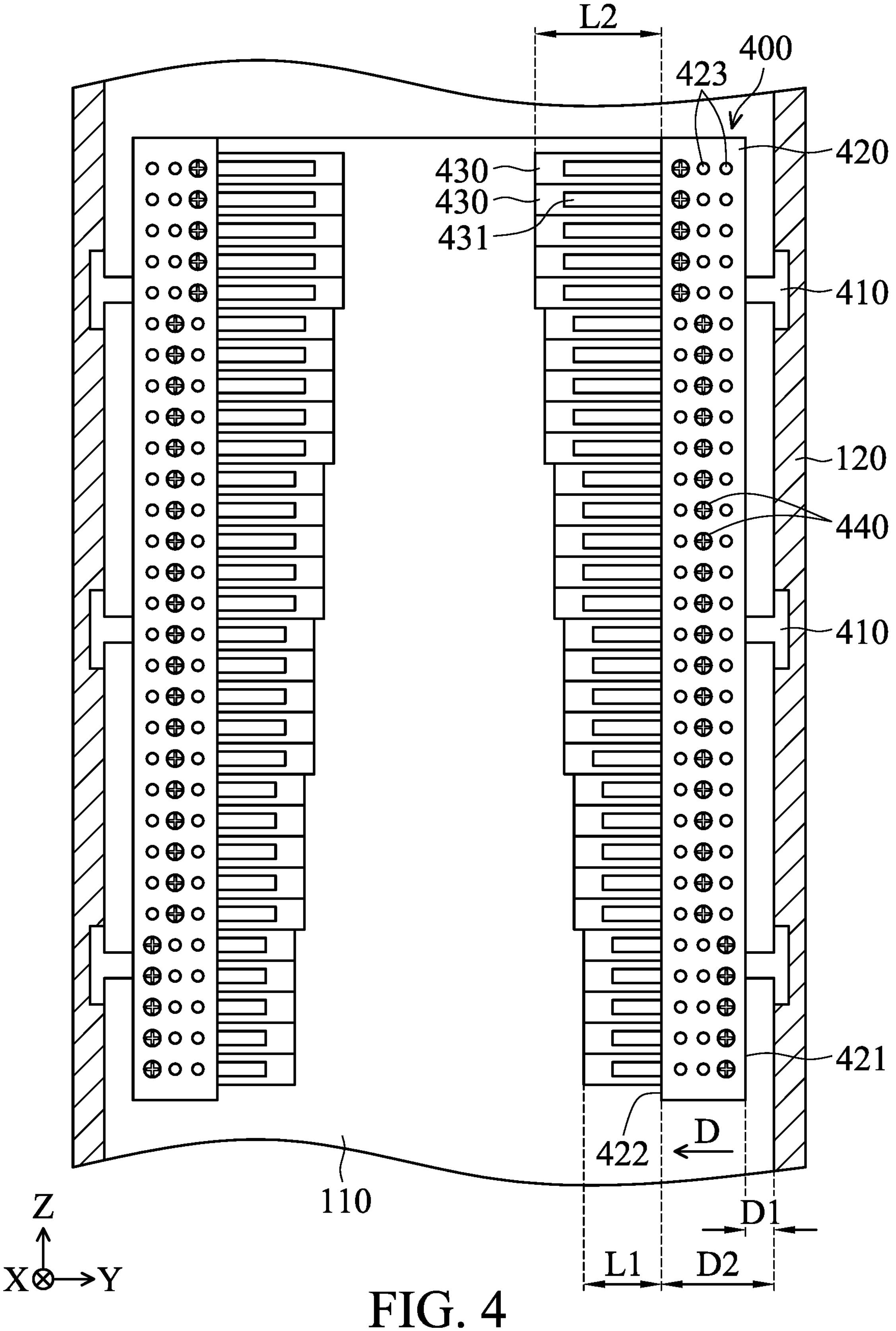
FIG. 4 is a schematic diagram of the adjustment plate according to an embodiment of the disclosure.

Referring to FIG. 4, in this embodiment, the adjustment plate 400 includes at least one fixed portion 410, at least one frame portion 420, a plurality of fin portions 430, and a plurality of fixing members 440. The fixed portion 410 is affixed to the wall 120 of the deposition chamber 100. The frame portion 420 includes a first side 421 and a second side 422, the first side 421 faces the wall 120 of the deposition chamber 100, and the second side 422 is opposite to the first side 421. Therefore, the distance D1 between the first side 421 and the wall 120 of the deposition chamber 100 is less than or equal to the distance D2 between the second side 422 and the wall 120 of the deposition chamber 100. The fixed portion 410 is connected to the first side 421 of the frame portion 420, thus, the frame portion 420 can be affixed to the deposition chamber 100 via the fixed portion 410 and hung in the inner space 110 of the deposition chamber 100.

A plurality of first holes 423 are formed on the frame portion 420, and each of the pin portions 430 has a second hole 431. Each fixing member 440 (such as a screw, a pin, or a rivet) can pass through the second hole 431 of the corresponding fin portion 430 and one of the first holes 423 to affix the fin portion 430 to the frame portion 420. When the fin portions 430 are affixed to the frame portion 420, the fin portions 430 can protrude from the second side 422 of the frame portion 420, so that it can block some material of the target 200 when the film is coated on the substrate S.

In this embodiment, the first holes 423 are arranged in matrix, so that at least a portion of the first holes 423 are arranged along a direction D from the first side 421 to the second side 422 of the frame 420 (i.e. the Y-axis in the figures). Thus, the lengths of the fin portions 430 can be the same, and the user can adjust the length of each fin portion 430 protruding from the second side 422 by passing the fixing member 440 through the different first holes 423 in the direction D. Moreover, each second hole 431 can include a longitudinal structure along the direction D, so as to further slightly adjust the length of each fin portion 430 protruding from the second side 422.

The length of each fin portion 430 protruding from the second side 422 can be determined by the corresponding portion of the substrate S and the consumption of the target 200. For example, in this embodiment, the lengths L1 of the fin portions 430 protruding from the second side 422, which correspond to the curved surface 321 of the first supporting portion 320 (i.e. correspond to the curved surface section S1 of the substrate S), is less than or equal to the lengths L2 of the fin portions 430 protruding from the second side 422, which correspond to the inclined surface 331 of the second supporting portion 330 (i.e. correspond to the flat surface section S2 of the substrate S). Therefore, more material of the target 200 can be fallen on the curved surface section S1 during the deposition, and the uneven problem of the film thickness can be reduced.

Figure 5:
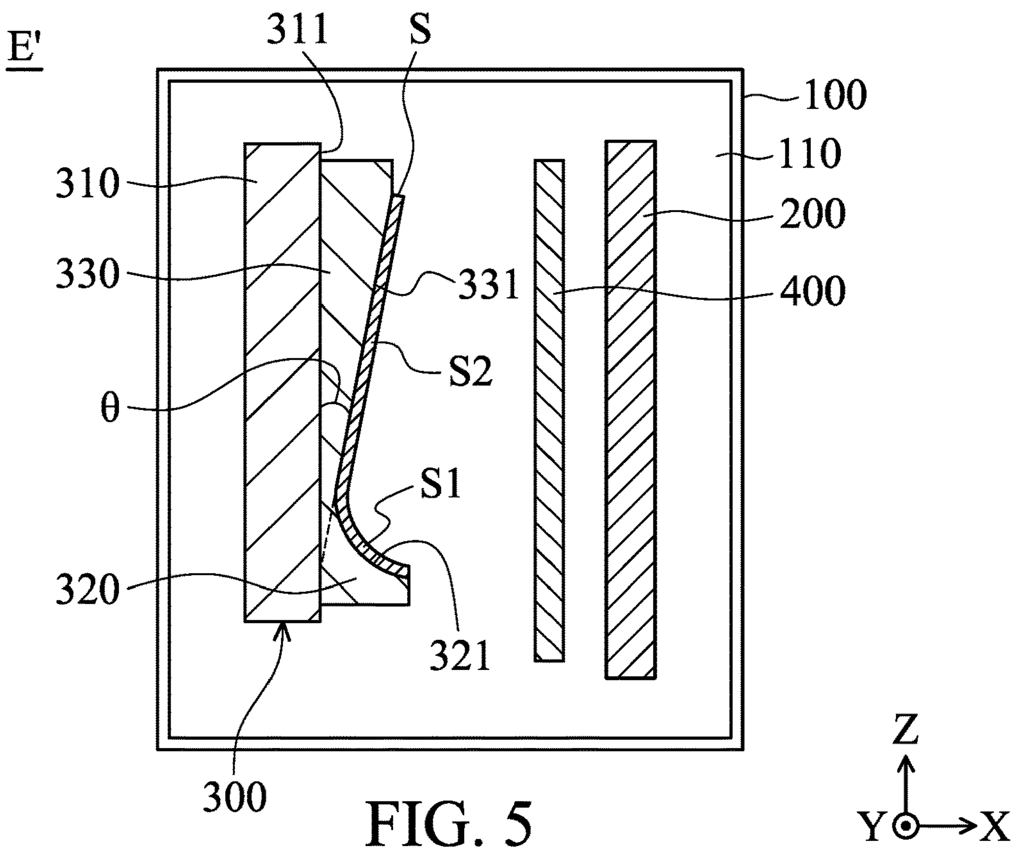
FIG. 5 is a schematic diagram of a deposition apparatus according to another embodiment of the disclosure.

Referring to FIG. 5, in another embodiment of the disclosure, a deposition apparatus E' primarily includes a deposition chamber 100, a target 200, a substrate holder 300, and an adjustment plate 400. The structures of the deposition chamber 100, the target 200, the substrate holder 300, and the adjustment plate 400 of the deposition apparatus E' are substantially the same as the structures of the deposition chamber 100, the target 200, the substrate holder 300, and the adjustment plate 400 of the deposition apparatus E, so that the features thereof are not repeated in the interest of brevity.

Specifically, in this embodiment, the first supporting portion 320 and the second supporting portion 330 of the substrate holder 300 are integrally formed as one piece, so that the supporting strength for the substrate S can be increased.

Figure 6:
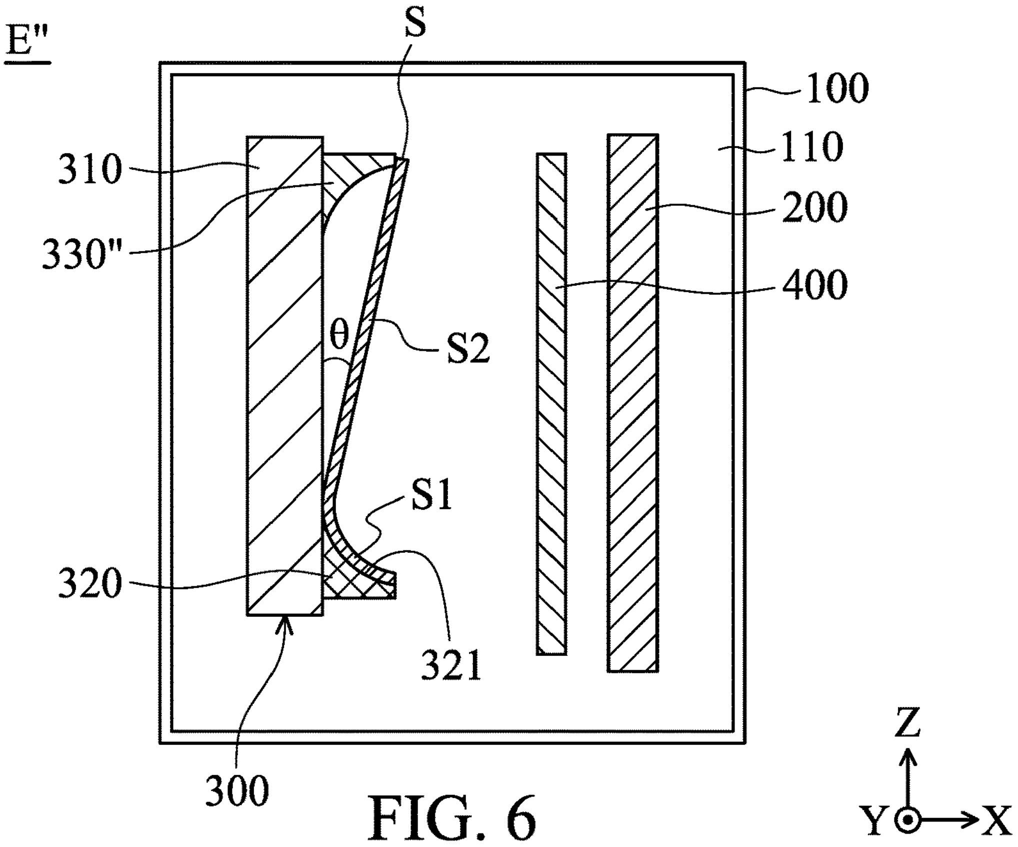
FIG. 6 is a schematic diagram of a deposition apparatus according to another embodiment of the disclosure.

Referring to FIG. 6, in another embodiment of disclosure, a deposition apparatus E" primarily includes a deposition chamber 100, a target 200, a substrate holder 300, and an adjustment plate 400, and the substrate holder 300 includes a base portion 310, a first supporting portion 320, and a second supporting portion 330". The structures of the deposition chamber 100, the target 200, the adjustment plate 400, and the first supporting portion 320 of the deposition apparatus E" are substantially the same as the structures of the deposition chamber 100, the target 200, the adjustment plate 400, and the first supporting portion 320 of the deposition apparatus E, so that the features thereof are not repeated in the interest of brevity.

In this embodiment, the second supporting portion 330" is disposed on and protrudes from the flat surface 311 of the base portion 310. A gap is formed between the second supporting portion 330" and the first supporting portion 320. When the substrate S is disposed on the substrate holder 300, the second supporting portion 330" can be in contact with the flat surface section S2 of the substrate S and raise the flat surface section S2 of the substrate S, and the flat surface section S2 of the substrate S is inclined relative to the flat surface 311 of the base portion 310 accordingly. An included angle θ is formed between the inclined flat surface section S2 and the flat surface 311 of the base portion 310. The included angle θ can be greater than 0 degrees and less than or equal to 90 degrees (such as be ranged from 1 degree to 50 degrees).

Owing to the aforementioned structures of the deposition apparatus E", the cost of the deposition apparatus E" can be further saved, and the uneven problem of the film thickness of the substrate S can be still solved by using the deposition apparatus E".

Although there is one target, one substrate holder, and one adjustment plate disposed in one deposition chamber shown in FIG. 5 and FIG. 6, multiple targets, multiple substrate holders, and multiple adjustment plates can be disposed in one deposition chamber in some embodiments (not shown). Thus, the speed and the yield of forming a film with multiple layers can be facilitated. In detail, the multiple targets can be disposed in the deposition chamber. Each of the substrate holders can include a base portion having a flat surface, a first supporting portion having a curved surface and disposed on the flat surface of the base portion, and a second supporting portion disposed on the flat surface of the base portion and protruding therefrom, as mentioned before. The multiple adjustment plates are disposed in the deposition chamber, and each adjustment plate is disposed between one of the multiple targets and one of the substrate holders.

In another embodiment of the disclosure, the deposition apparatus E'" includes a deposition chamber, ate least one substrate holder, multiple targets, and multiple adjustment plate. The deposition method of using the deposition apparatus E'" includes the steps of disposing at least one substrate on at least one substrate holder before the substrate entering the deposition chamber and forming at least one substrate chamber with the substrate. As mentioned before, if the at least one substrate includes a flat surface section and a curved surface section, the at least one substrate holder can be configured as the design in FIG. 1, FIG. 2, FIG. 5, or FIG. 6. An included angle θ can be formed between the flat surface section and the flat surface of the at least one substrate holder, and the included angle θ is greater than 0 degrees and less than or equal to 90 degrees (for example, the included angle θ can be ranged from 1 degree to 50 degrees).

Figure 7A:
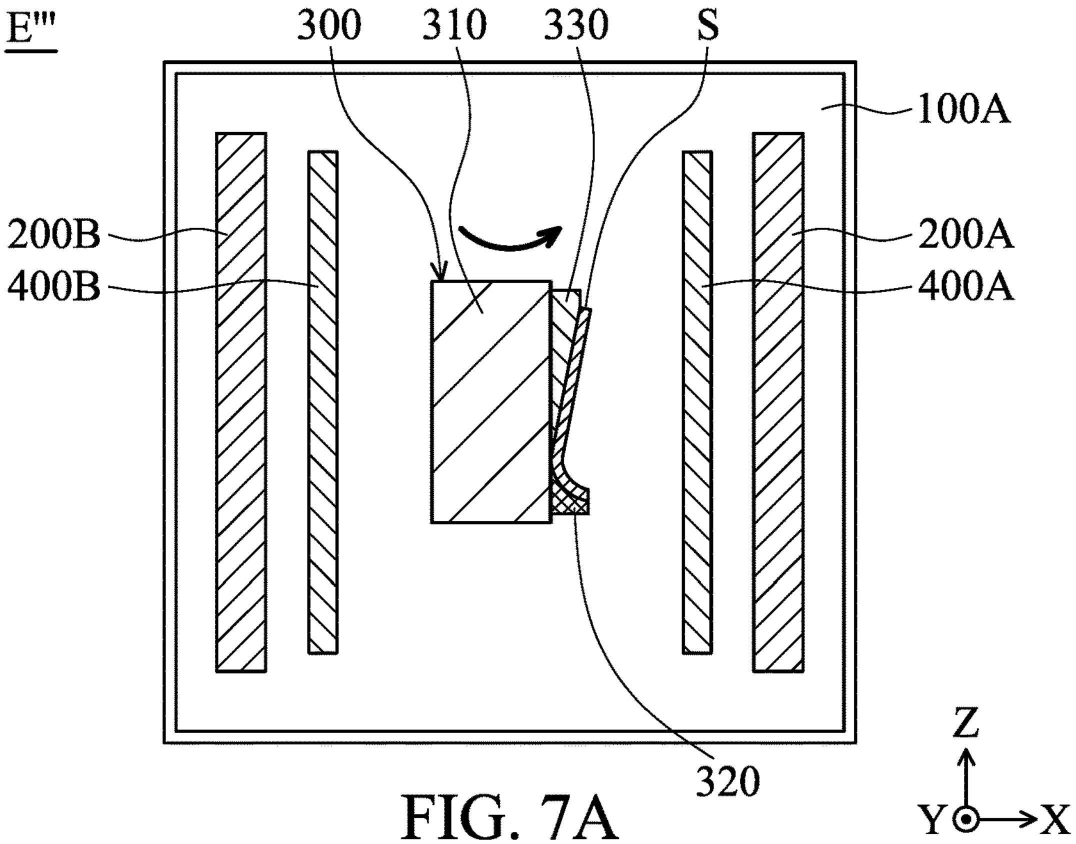
FIG. 7A is a schematic diagram representing that the substrate holder with the substrate rotates to a position corresponding to the first target according to another embodiment of the disclosure.

Referring to FIG. 7A, a deposition chamber 100A is provided, wherein a first target 200A, a second target 200B, a first adjustment plate 400A, and a second adjustment plate 400B are disposed inside the deposition chamber 100A. A substrate holder with the substrate (such as a substrate holder 300 with the substrate S shown in FIG. 7A) can be transferred into the deposition chamber 100A, then the substrate holder 300 with the substrate S can be rotated to a position corresponding to the first target 200A, and the first adjustment plate 400A can be disposed between the first target 200A and the substrate holder 300 with the substrate S. After that, a deposition process can be started. The material of the first target 200A can pass through the first adjustment plate 400A and deposit on the substrate S.

The structure of the first adjustment plate 400A can be similar to the structure of the adjustment plate 400 of the deposition apparatus E, and the structure of the substrate holder 300 can be similar to the structure of the substrate holder 300 of the deposition apparatus E.

Figure 7B:
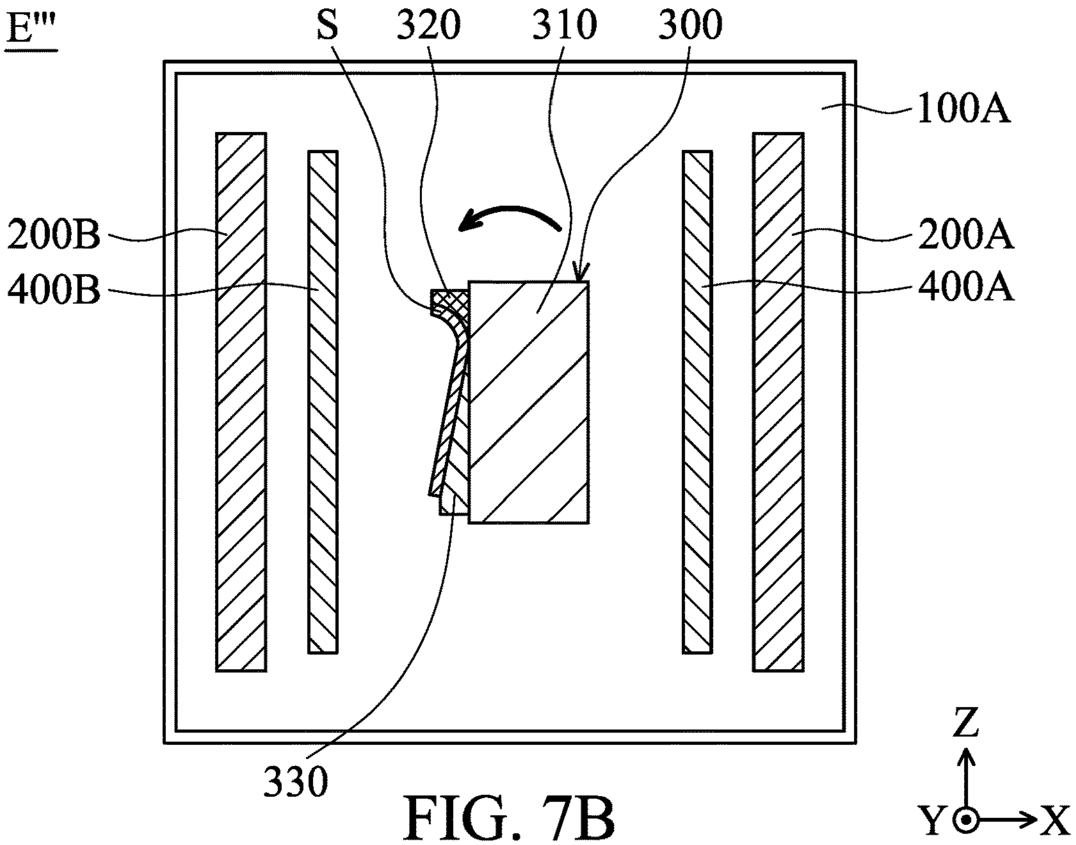
FIG. 7B is a schematic diagram representing that the substrate holder with the substrate rotates to a position corresponding to the second target according to an embodiment of the disclosure.

Subsequently, as shown in FIG. 7B, the substrate holder 300 with the substrate S can be rotated to let the substrate S move from the position corresponding to the first target 200A to a position corresponding to the second target 200B, and the second adjustment plate 400B can be disposed between the second target 200B and the at least one substrate holder 300 with the substrate S. After that, a deposition process can be started. The material of the second target 200B can pass through the second adjustment plate 400B and deposit on the material of the first target 200A which is on the substrate S. For example, the rotating speed of the substrate holder 300 can be ranged from 40 rpm (revolutions per minute) to 60 rpm.

Therefore, the deposition apparatus E'" can deposit a plurality of layers with different targets on the substrate S. It should be noted that, although the deposition apparatus E'" in this embodiment takes an example in that two layers of targets including the first target 200A and the second target 200B are deposited on the substrate S, it is not limited thereto. The user can add the third or more adjustment plates and the third or more targets in the deposition apparatus as required, but it is not limited thereto. Moreover, in the deposition apparatus E'", after the material of the second target 200B is deposited on the material of the first target 200A that is on the substrate S, the substrate holder 300 can rotate again to let the substrate S move to the position corresponding to the first target 200A, and the first adjustment plate 400A is disposed between the first target 200A and the substrate holder 300 with the substrate S. After that, a deposition process can be further started. The material of the first target 200A can pass through the first adjustment plate 400A again and deposit on the material of the second target 200B that is on the substrate S.

Although there is two targets, one substrate holder, and two adjustment plates disposed in one deposition chamber shown in FIG. 7A and FIG. 7B, multiple targets, multiple substrate holders, and multiple adjustment plates can be disposed in one deposition chamber in some embodiments (not shown). Thus, the speed and the yield of forming a film with multiple layers can be facilitated. In detail, the multiple targets can be disposed in the deposition chamber. Each of the substrate holders can include a base portion having a flat surface, a first supporting portion having a curved surface and disposed on the flat surface of the base portion, and a second supporting portion disposed on the flat surface of the base portion and protruding therefrom, as mentioned before. The multiple adjustment plates are disposed in the deposition chamber, and each adjustment plate is disposed between one of the multiple targets and one of the substrate holders. In some embodiments (not shown), the deposition apparatus can includes multiple deposition chambers, multiple substrate holders, multiple targets, and multiple adjustment plates. In one of the multiple deposition chambers, one target, one adjustment plate, and one substrate holder can be disposed therein. The structure of each of the adjustment plates can be similar to the structure of the adjustment plate of the aforementioned deposition apparatus, and the structure of each of the substrate holders can be similar to the structure of the substrate holder of the aforementioned deposition apparatus.

The features between the aforementioned embodiments can be used or combined as long as they do not violate or conflict the spirit of the present application.

In summary, an embodiment of the disclosure provides a deposition apparatus, including a deposition chamber, at least one target, at least one substrate holder, and at least one adjustment plate. The at least one target, the at least one substrate holder, and the at least one adjustment plate are disposed in the deposition chamber, and the at least one adjustment plate is disposed between the at least one target and the at least one substrate holder. The at least one substrate holder includes a base portion, a first supporting portion, and a second supporting portion. The base portion has a flat surface. The first supporting portion is disposed on the flat surface and includes a curved surface. The second supporting portion is disposed on the flat surface and protrudes from it.

An embodiment of the disclosure also provides a deposition method, including providing at least one substrate, wherein the at least one substrate includes a flat surface section and a curved surface section. The method includes providing at least one substrate holder. The method includes disposing the at least one substrate on the at least one substrate holder to form at least one substrate holder with a substrate, and forming an included angle between the flat surface section and the flat surface of the at least one substrate holder, wherein the included angle is greater than 0 degrees and less than or equal to 90 degrees. The method includes providing a deposition chamber, wherein a first target, a second target, a first adjustment plate, and a second adjustment plate are disposed in the deposition chamber. The method includes transferring the at least one substrate holder with a substrate to the deposition chamber and rotating the at least one substrate holder with a substrate to a position corresponding to the first target, wherein the first adjustment plate is disposed between the first target and the at least one substrate holder with a substrate. The method includes depositing the material of the first target on the at least one substrate. The method includes rotating the at least one substrate holder with a substrate to a position corresponding to the second target in the deposition chamber, wherein the second adjustment plate is disposed between the second target and the at least one substrate holder with a substrate. The method includes depositing the material of the second target on the material of the first target that is on the at least one substrate.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the disclosure has been described by way of example and in terms of preferred embodiment, it should be understood that the disclosure is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A deposition apparatus, configured to deposit on at least one substrate, comprising:
- a deposition chamber;
- a first target, disposed in the deposition chamber;
- a second target, disposed in the deposition chamber;
- at least one substrate holder, disposed in the deposition chamber and disposed between the first target and the second target, wherein the at least one substrate holder comprises:
- a base portion, having a flat surface;
- a first supporting portion, disposed on the flat surface and having a curved surface; and
- a second supporting portion, disposed on the flat surface and protruding from the flat surface; and
- at least one adjustment plate, disposed in the deposition chamber and disposed between the first target or the second target and the at least one substrate holder, wherein the at least one adjustment plate comprises:
- a fixed portion, affixed to a wall of the deposition chamber;
- a frame portion, connected to the fixed portion;
- a plurality of fin portions, affixed to the frame portion; and
- a plurality of fixing members, wherein the frame portion comprises a plurality of first holes, and each of the fin portions comprises a second hole,
- wherein at least a portion of the first holes are arranged in a line that is substantially perpendicular to the wall,
- wherein each of the fixing members passes through the second hole of the corresponding fin portion and one of the first holes to affix the corresponding fin portion to the frame portion,
- wherein the first supporting portion and the second supporting portion are detachable from the base portion.

2. The deposition apparatus as claimed in claim 1, wherein the at least one substrate comprises a flat surface section and a curved surface section, wherein when the at least one substrate is disposed on the substrate holder, the curved surface section is in contact with the curved surface of the first supporting portion, the flat surface section is in contact with the second supporting portion, an included angle is formed between the flat surface section and the flat surface, and the included angle is greater than 0 degrees and less than 90 degrees.

3. The deposition apparatus as claimed in claim 2, wherein the included angle is between 1 degree and 50 degrees.

4. The deposition apparatus as claimed in claim 1, wherein the frame portion has a first side and a second side, a distance between the first side and the wall of the deposition chamber is less than or equal to a distance between the second side and the wall of the deposition chamber, and at least a portion of the first holes are arranged along a direction from the first side to the second side.

5. The deposition apparatus as claimed in claim 4, wherein at least one of the second holes has a longitudinal structure along the direction.

6. The deposition apparatus as claimed in claim 1, wherein the frame portion has a first side and a second side, a distance between the first side and the wall of the deposition chamber is less than or equal to a distance between the second side and the wall of the deposition chamber, and lengths of the fin portions protruding from the second side, which correspond to the curved surface, is less than or equal to the lengths of the remaining fin portions protruding from the second side.

7. The deposition apparatus as claimed in claim 1, wherein the deposition apparatus further comprises a plurality of pad units, disposed on the at least one substrate holder.

8. The deposition apparatus as claimed in claim 7, wherein each of the pad units comprises:

a pad base;

a pad, disposed on the pad base; and a spring, connected to the pad base.

9. The deposition apparatus as claimed in claim 8, wherein each of the pad units further comprises a vacuum suction hole, penetrating the pad base and the pad.

10. The deposition apparatus as claimed in claim 1, wherein the first supporting portion and the second supporting portion are affixed to the base portion independently.

11. The deposition apparatus as claimed in claim 1, wherein the first supporting portion and the second supporting portion are integrally formed as one piece.

12. The deposition apparatus as claimed in claim 1, wherein the second supporting portion has an inclined surface, and the curved surface and the inclined surface are connected to each other.

13. The deposition apparatus as claimed in claim 1, wherein a gap is formed between the first supporting portion and the second supporting portion.

14. The deposition apparatus as claimed in claim 1, wherein the second supporting portion has a surface, and the surface faces the at least one substrate and is spaced away from the at least one substrate when the at least one substrate is in contact with the second supporting portion.

15. A deposition method, comprising:

providing at least one substrate, wherein the at least one substrate has a flat surface section and a curved surface section;

providing at least one substrate holder comprising a base portion, a first supporting portion, and a second supporting portion, wherein the first supporting portion and the second supporting portion are detachably disposed on the base portion;

disposing the at least one substrate on the at least one substrate holder to form at least one substrate holder with a substrate, and forming an included angle between the flat surface section and the flat surface of the at least one substrate holder, wherein the included angle is greater than 0 degrees and less than or equal to 90 degrees;

providing a deposition chamber, wherein a first target, a second target, a first adjustment plate, and a second adjustment plate are disposed in the deposition chamber, wherein the first adjustment plate or the second adjustment plate comprises:

a fixed portion, affixed to a wall of the deposition chamber;

a frame portion, connected to the fixed portion;

a plurality of fin portions, affixed to the frame portion; and a plurality of fixing members, wherein the frame portion comprises a plurality of first holes, and each of the fin portions comprises a second hole, wherein at least a portion of the first holes are arranged in a line that is substantially perpendicular to the wall, wherein each of the fixing members passes through the second hole of the corresponding fin portion and one of the first holes to affix the corresponding fin portion to the frame portion;

transferring the at least one substrate holder with a substrate to the deposition chamber and rotating the at least one substrate holder with a substrate to a position corresponding to the first target, wherein the first adjustment plate is disposed between the first target and the at least one substrate holder with a substrate, and the at least one substrate holder with a substrate is disposed between the first target and the second target;

depositing a material of the first target on the at least one substrate;

rotating the at least one substrate holder with a substrate to a position corresponding to the second target, wherein the second adjustment plate is disposed between the second target and the at least one substrate holder with a substrate; and depositing a material of the second target on the material of the first target that is on the at least one substrate.

16. The deposition method as claimed in claim 15, wherein in the steps of rotating the at least one substrate holder with a substrate, a rotating speed of the at least one substrate holder with a substrate is between 40 rpm and 60 rpm.

17. The deposition method as claimed in claim 15, wherein the included angle is between 1 degree and 50 degrees.

18. The deposition method as claimed in claim 15, wherein the substrate holder has a curved surface and an inclined surface, a curvature of the curved surface matches a curvature of the curved surface section, and a slope of the inclined surface matches a slope of the flat surface section.

19. The deposition method as claimed in claim 15, further comprising:

rotating the at least one substrate holder with a substrate to the position corresponding to the first target again; and depositing the material of the first target on the material of the second target that is on the at least one substrate.

20. The deposition method as claimed in claim 15, wherein the second supporting portion has a surface, and the surface faces the at least one substrate and is spaced away from the at least one substrate when the at least one substrate is in contact with the second supporting portion.

* * * * *